United States Patent
Gibbs et al.

(10) Patent No.: US 8,712,233 B2
(45) Date of Patent: Apr. 29, 2014

(54) ELECTRONIC DEVICE ASSEMBLIES

(75) Inventors: Kevin D. Gibbs, San Carlos, CA (US);
Carl R. Peterson, Santa Clara, CA (US);
Erik A. Uttermann, San Francisco, CA (US); Conor P. Lenahan, Cupertino, CA (US); John P. Ternus, Los Altos Hills, CA (US); Justin R. Wodrich, Saratoga, CA (US); Elvis M. Kibiti, San Francisco, CA (US); Derek Wright, San Francisco, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 13/413,525

(22) Filed: Mar. 6, 2012

(65) Prior Publication Data

US 2013/0223836 A1    Aug. 29, 2013

Related U.S. Application Data

(60) Provisional application No. 61/603,118, filed on Feb. 24, 2012.

(51) Int. Cl.
*G03B 1/00* (2006.01)
*G03B 17/30* (2006.01)
*G03B 17/22* (2006.01)

(52) U.S. Cl.
CPC . *G03B 1/00* (2013.01); *G03B 17/30* (2013.01); *G03B 17/22* (2013.01)
USPC .......................................... 396/535; 343/702

(58) Field of Classification Search
CPC ......... G03B 1/00; G03B 17/30; G03B 17/022
USPC .......................................... 343/702; 396/535
See application file for complete search history.

(56) References Cited

U.S. PATENT DOCUMENTS

| 5,768,217 A | 6/1998 | Sonoda et al. |
| 5,872,557 A | 2/1999 | Wiemer et al. |

(Continued)

FOREIGN PATENT DOCUMENTS

| EP | 0543645 | 5/1993 |
| EP | 1868263 | 12/2007 |

(Continued)

OTHER PUBLICATIONS

Garelli et al., U.S. Appl. No. 12/862,748, filed Aug. 24, 2010.

(Continued)

*Primary Examiner* — Clayton E Laballe
*Assistant Examiner* — Kevin Butler
(74) *Attorney, Agent, or Firm* — Treyz Law Group; G. Victor Treyz; Kendall P. Woodruff

(57) ABSTRACT

An electronic device may have a conductive housing. A dielectric structure may be mounted in the conductive housing to form an antenna window. An electrical component such as a camera, light sensor, or other device may press against a conductive foam structure. A printed circuit may have conductive traces that form an antenna ground and antenna resonating element. The printed circuit may be wrapped around a support structure. The electrical component, the conductive foam structure, and the printed circuit wrapped around the support structure may be compressed between a display cover layer and the antenna window. A camera window may be attached to a camera window trim using multiple adhesives. The trim may have a curved exterior surface that matches a curved housing surface. A flexible printed circuit cable may have a folded portion. A band structure may surround the folded portion to form a service loop.

20 Claims, 20 Drawing Sheets

(56) References Cited

U.S. PATENT DOCUMENTS

| | | |
|---|---|---|
| 6,344,825 B1 | 2/2002 | Wong |
| 6,642,892 B2 | 11/2003 | Masaki et al. |
| 6,985,361 B2 | 1/2006 | Credelle et al. |
| 7,075,782 B2 | 7/2006 | Teshima |
| 7,230,575 B2 | 6/2007 | Jeong |
| 7,256,743 B2 | 8/2007 | Korva |
| 7,322,833 B1 | 1/2008 | Hakansson et al. |
| 7,579,993 B2 | 8/2009 | Lev et al. |
| 7,605,765 B2 | 10/2009 | Ku |
| 7,710,331 B2 | 5/2010 | Schillmeier et al. |
| 2003/0001780 A1 | 1/2003 | Hill et al. |
| 2003/0197648 A1 | 10/2003 | Quinn et al. |
| 2005/0200535 A1 | 9/2005 | Elkobi et al. |
| 2006/0227053 A1 | 10/2006 | Ishikura |
| 2007/0296592 A1 | 12/2007 | Huang et al. |
| 2008/0316117 A1 | 12/2008 | Hill et al. |
| 2008/0316121 A1* | 12/2008 | Hobson et al. ............ 343/702 |
| 2009/0133825 A1 | 5/2009 | Prat et al. |
| 2009/0174612 A1 | 7/2009 | Ayala et al. |
| 2009/0218041 A1* | 9/2009 | Dean et al. ............... 156/305 |
| 2009/0265969 A1 | 10/2009 | Nezu |
| 2009/0295648 A1 | 12/2009 | Dorsey et al. |
| 2010/0073241 A1* | 3/2010 | Ayala Vazquez et al. ..... 343/702 |
| 2011/0006953 A1 | 1/2011 | Chiang et al. |
| 2011/0025575 A1 | 2/2011 | Niederkorn et al. |
| 2011/0183721 A1* | 7/2011 | Hill et al. ................. 455/566 |
| 2011/0255250 A1* | 10/2011 | Dinh et al. ............... 361/749 |
| 2011/0267785 A1 | 11/2011 | Chang et al. |
| 2012/0050114 A1* | 3/2012 | Li et al. .................. 343/702 |
| 2012/0087065 A1 | 4/2012 | Kim et al. |
| 2012/0194998 A1* | 8/2012 | McClure et al. ......... 361/679.56 |
| 2012/0223865 A1* | 9/2012 | Li et al. .................. 343/702 |
| 2012/0223866 A1* | 9/2012 | Ayala Vazquez et al. ..... 343/702 |
| 2013/0051785 A1* | 2/2013 | Pope et al. ............... 396/535 |

FOREIGN PATENT DOCUMENTS

| | | |
|---|---|---|
| EP | 2110882 | 4/2009 |
| GB | 2437838 | 11/2007 |
| JP | 2003280815 | 10/2003 |
| JP | 2006048166 | 2/2006 |
| JP | 2008306552 | 12/2008 |
| KR | 10-2007-0016731 | 2/2007 |
| KR | 10-2010-0062539 | 6/2010 |
| WO | 2007083500 | 7/2007 |

OTHER PUBLICATIONS

Springer et al. U.S. Appl. No. 12/486,486, filed Jun. 17, 2009.

* cited by examiner

ELECTRONIC DEVICE ASSEMBLIES

This application claims the benefit of provisional patent application No. 61/603,118, filed Feb. 24, 2012, which is hereby incorporated by reference herein in its entirety.

BACKGROUND

This relates generally to electronic devices, and more particularly, to structures for mounting components within electronic devices.

Electronic devices such as portable computers and cellular telephones contain electrical components such as displays, wireless circuitry, sensors, and communications buses. It can be challenging to mount desired electrical components within an electronic device housing. Space is generally at a premium, particularly in compact devices. If care is not taken, device performance may suffer or device housing structures may be bulkier than desired.

It would therefore be desirable to be able to provide improved techniques for mounting components within electronic devices.

SUMMARY

An electronic device such as a tablet computer or other electronic equipment may have a housing. A display and other components may be mounted in the housing. Internal electrical components in the housing may include wireless circuits such as transceiver circuits, optical components such as light sensors and cameras, and other devices.

A housing for an electronic device may be formed from a conductive material. A dielectric structure may be mounted in a conductive housing to form an antenna window. An electrical component such as a camera, light sensor, or other device may press against a conductive foam structure in the electronic device. A flexible printed circuit may have conductive traces that form an antenna ground and antenna resonating element. The flexible printed circuit may be wrapped around a support structure.

One or more electrical components, the conductive foam structure and the printed circuit wrapped around the support structure may be compressed between a display cover layer and the antenna window. In this configuration, an electrical component such as a camera may press against the conductive foam. The conductive foam may press against the antenna ground. Pressure from the conductive foam may press the support structure and the antenna resonating element against the antenna window.

A camera window may be attached to a camera window trim using multiple adhesives. The adhesives may include an ultraviolet-light-curing adhesive and a hot melt adhesive. The trim may have a ring shape that surrounds a peripheral edge of the camera window. When mounted in the housing of the electronic device, the trim may have an exposed exterior surface. The housing may have a curved surface. The camera window may be mounted in an opening in the curved surface. The camera trim may surround the camera window and may have a curved exterior surface that matches the curved housing surface. Grooves may be formed on the curved exterior surface.

Signals may be routed within the electronic device using a flexible printed circuit cable. The flexible printed circuit cable may have a folded portion. A band structure may surround the folded portion to form a service loop. The flexible printed circuit cable may have one end that is coupled to an electronic component such as a display and another end that is coupled to a component such as a printed circuit board. During assembly and disassembly operations, the flexible printed circuit cable may slide within the band structure to accommodate movement between the components at the ends of the flexible printed circuit cable.

Further features of the invention, its nature and various advantages will be more apparent from the accompanying drawings and the following detailed description of the preferred embodiments.

DETAILED DESCRIPTION

Figure 1:
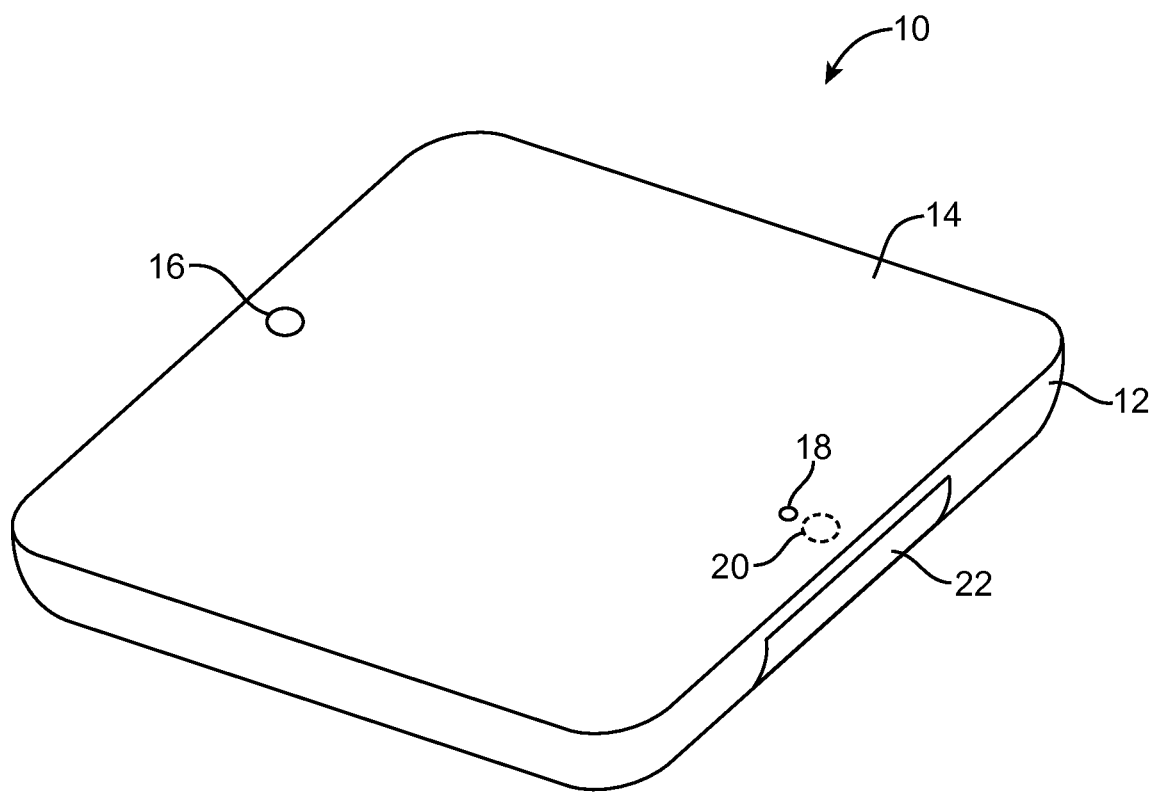
FIG. 1 is a perspective view of an illustrative electronic device in accordance with an embodiment of the present invention.

Electronic devices such as electronic device 10 of FIG. 1 may be provided with electronic components. The electronic components may include wireless circuit components such as antenna structures and transceivers, optical component such as light sensors and cameras, interconnection paths such as flexible printed circuit signal bus structures, and other components.

Electronic device 10 may be a portable electronic device or other suitable electronic device. For example, electronic device 10 may be a laptop computer, a tablet computer, a somewhat smaller device such as a wrist-watch device, pendant device, headphone device, earpiece device, or other wearable or miniature device, a cellular telephone, or a media player. Device 10 may also be a television, a set-top box, a desktop computer, a computer monitor into which a computer has been integrated, or other suitable electronic equipment.

Device 10 may have a display such as display 14 that is mounted in a housing such as housing 12. Display 14 may, for example, be a touch screen that incorporates capacitive touch electrodes or may be a display that is not touch sensitive. Display 14 may include image pixels formed from light-emitting diodes (LEDs), organic LEDs (OLEDs), plasma cells, electrowetting pixels, electrophoretic pixels, liquid crystal display (LCD) components, or other suitable image pixel structures.

A display cover layer such as a layer of cover glass or a transparent plastic layer may cover the surface of display 14. The display cover layer may have one or more openings. For example, the cover layer may have an opening to accommodate button 16. Windows may be provided in the display cover layer to allow light to pass through the display cover layer in connection with the operation of a light sensor, camera, or other optical component. As shown in FIG. 1, for example, the display cover layer may have a window such as transparent camera window 18 to accommodate a front-facing camera and an opening such as window 20 to accommodate an ambient light sensor. Camera windows and openings for accommodating other internal electrical components may also be formed in housing 12 (e.g., to form a camera window for a rear-facing camera).

Housing 12, which may sometimes be referred to as a case, may be formed of plastic, glass, ceramics, fiber composites, metal (e.g., stainless steel, aluminum, etc.), other suitable materials, or a combination of these materials. In some situations, housing or parts of housing 12 may be formed from dielectric or other low-conductivity material. In other situations, housing 12 or at least some of the structures that make up housing 12 may be formed from metal elements. In configurations for device 10 in which housing 12 is formed from conductive materials such as metal, one or more dielectric antenna windows such as antenna window 22 of FIG. 1 may be formed in housing 12.

Antenna window 22 may be formed from a dielectric such as plastic (as an example). Antennas in device 10 may be mounted within housing 12 so that antenna window 22 overlaps the antennas. During operation, radio-frequency antenna signals can pass through antenna window 22 and other dielectric structures in device 10 (e.g., edge portions of the cover glass for display 14).

Figure 2:
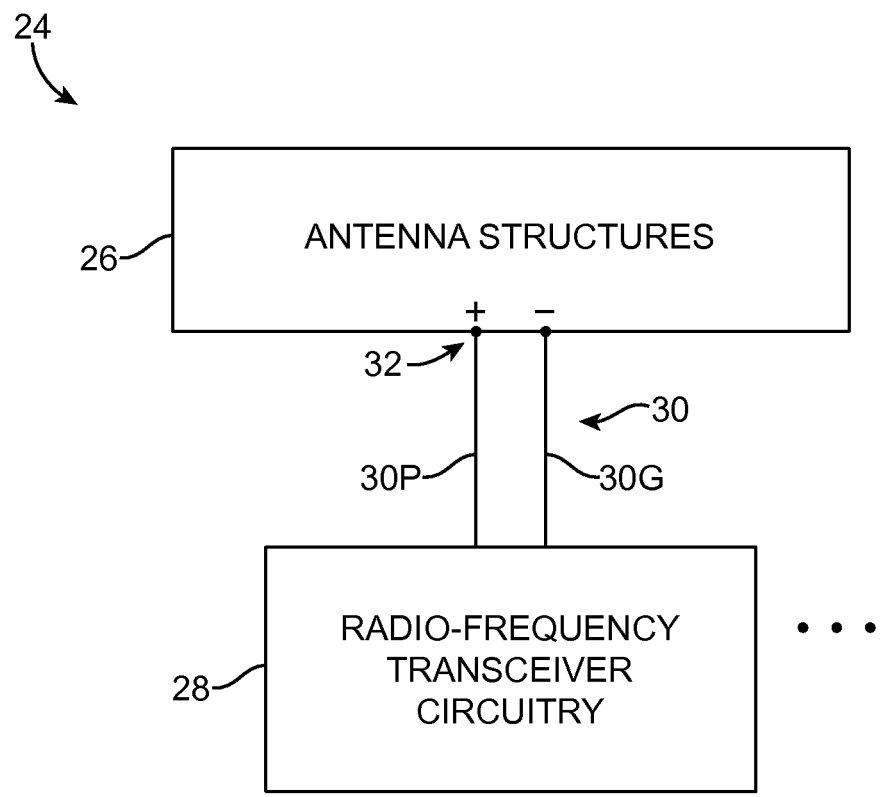
FIG. 2 is a schematic diagram of wireless communications circuitry for an electronic device of the type shown in FIG. 1 in accordance with an embodiment of the present invention.

FIG. 2 is a schematic diagram showing illustrative wireless circuitry that may be used in device 10. As shown in FIG. 2, wireless circuitry 24 may include radio-frequency transceiver circuitry such as radio-frequency transceiver circuitry 28. Radio-frequency transceiver circuitry 28 may include cellular telephone transceiver circuitry, wireless local area network transceiver circuitry, and satellite navigation system receiver circuitry such as Global Positioning System (GPS) circuitry and Global Navigation Satellite System (GLONASS) circuitry.

Radio-frequency transceiver circuitry 28 may be coupled to one or more antennas such as antenna structures 26 using signal paths such as transmission line path 30. Transmission line path 30 may include positive transmission line conductor 30P and ground transmission line conductor 30N. Transmission line path 30 may be include transmission line structures such as one or more segments of coaxial cable, microstrip transmission line structures, stripline transmission line structures, and other structures for conveying radio-frequency antenna signals. Front-end circuitry such as impedance matching circuits, filters, switches, and other circuitry may, if desired, be interposed within transmission line path 30. The arrangement of FIG. 2 is merely illustrative.

Antenna structures 26 may include antenna feed structures such as antenna feed 32. Transmission line 30 may be coupled to antenna feed 32 so that signals from transmitters within transceiver circuitry 28 may be transmitted through antenna structures 26 and so that signals received by antenna structures 26 may be conveyed to receivers within transceiver circuitry 28. Antenna feed 32 may have a positive antenna feed terminal (+) that is coupled to positive transmission line conductor 30P and a ground antenna feed terminal (−) that is coupled to ground transmission line conductor 30G. If desired, antenna structures 26 may be provided with multiple antenna feeds. Each feed may be associated with a respective antenna or multiple feeds may be associated with a common antenna.

Figure 3:
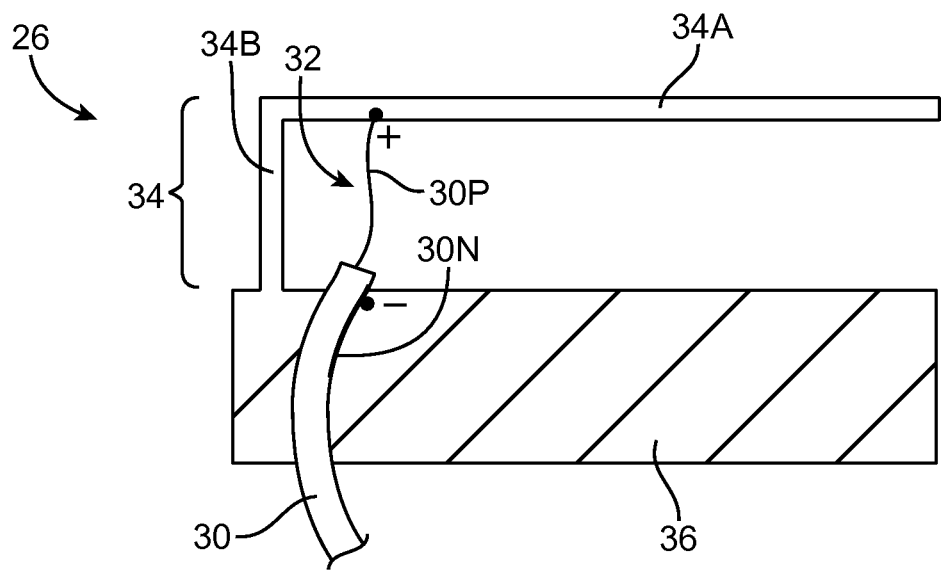
FIG. 3 is a diagram of illustrative antenna structures coupled to a transmission line in accordance with an embodiment of the present invention.

An illustrative configuration that may be used for one or more antennas in antenna structures 26 is shown in FIG. 3. In the illustrative configuration of FIG. 3, antenna 26 has been implemented using an inverted-F antenna design. This is merely illustrative. Antennas such as antenna 26 of FIG. 3 may be formed using patch antennas, monopole antennas, dipole antennas, loop antennas, open and closed slot antennas, helical antennas, planar inverted-F antennas, other suitable antennas, or hybrid antennas that include antenna structures associated with two or more different types of antenna.

As shown in FIG. 3, illustrative antenna 26 may have an antenna resonating element such as antenna resonating element 34 and an antenna ground such as antenna ground 36. Antenna resonating element 34 may have a main antenna resonating element arm such as arm 34A and a short circuit branch such as branch 34B that is coupled between arm 34A and antenna ground 36. Antenna feed 32 may be formed in a branch of antenna 26 that runs parallel to short circuit branch 34B and may be coupled to positive conductor 30P and ground conductor 30N of transmission line 30.

Antenna resonating element 34 may have multiple branches, curved portions, straight portions, portions with different widths, or any other suitable antenna resonating element shape. Resonating element 34 and antenna ground 36 may be formed from conductive structures in device 10 such as wires, traces on printed circuits (e.g., rigid printed circuit boards such as fiberglass-filled epoxy and flexible printed circuits formed from flexible sheets of polymer such as polyimide), metal housing structures, portions of electronic components such as shielding cans, brackets and other mounting structures, planar metal structures (e.g., sheet metal housing structures), peripheral conductive members that run around the rectangular periphery of an electronic device (e.g., a bezel or conductive housing sidewall), housing structures such as all or part of front, rear, or side housing structures, etc.

To ensure satisfactory performance, it may be desirable to accurately control the placement of antenna structures relative to other structures in device 10, such as antenna window 22 and conductive structures that might affect antenna performance. For example, it may be desirable to accurately control the placement of antenna ground structures relative to antenna resonating element 34A.

Figure 4:
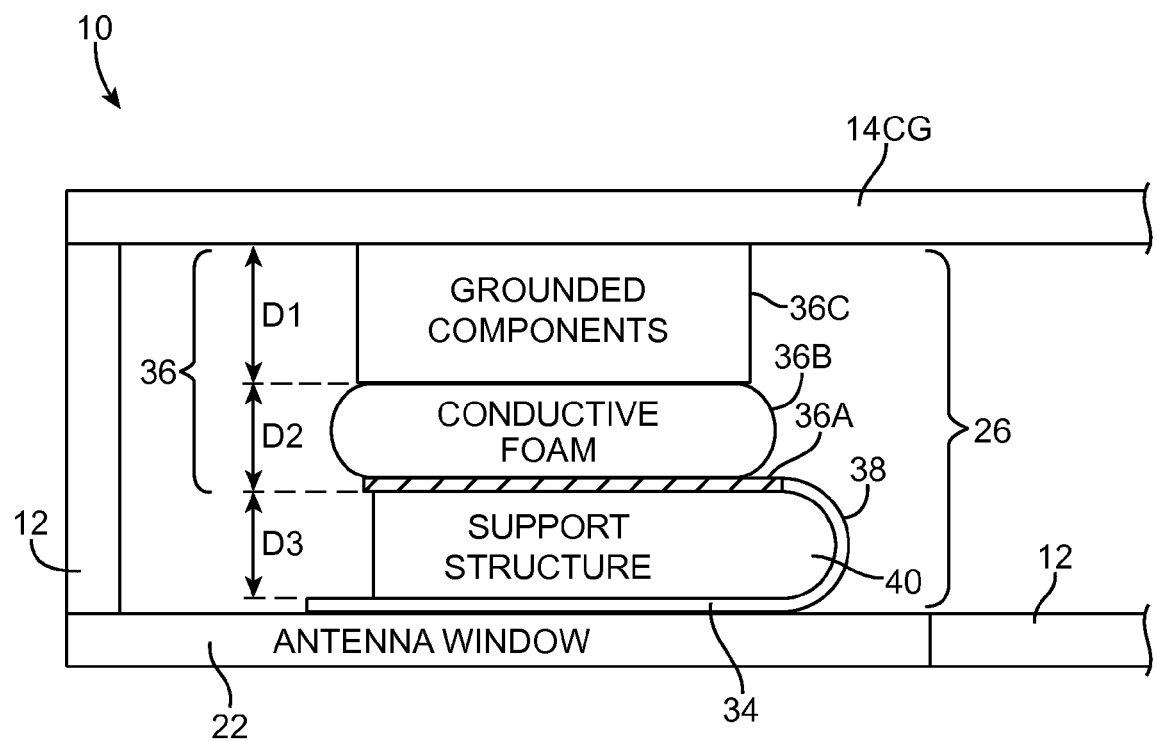
FIG. 4 is a diagram showing how antenna structures may be mounted within an electronic device housing in accordance with an embodiment of the present invention.

A cross-sectional side view of an illustrative configuration that may be used for antenna structures in device 10 is shown in FIG. 4. As shown in FIG. 4, antenna 26 may have an antenna ground formed from conductive structures such as one or more electrical components 36C, conductive foam 36B, and conductive antenna ground trace 36A on flexible printed circuit 38 (and, if desired, portions of conductive housing 12). Antenna resonating element 34 may be formed from conductive traces on flexible printed circuit 38. Antenna resonating element 34 may be mounted within device 10 so that antenna window 22 overlaps antenna resonating element 34. This allows radio-frequency signals associated with antenna 26 to pass through window 22.

Components 36C may include optical components, processing circuitry, audio devices, buttons, communications circuitry, circuitry mounted on one or more printed circuits, integrated circuit shielding cans, connectors, or other electrical components. As an example, components 36C may include an ambient light sensor and a digital camera.

Conductive foam structure 36B may include a layer of conducting foam and/or a layer of non-conducting foam that has a conducting coating such as a conductive fabric coating.

Support structure 40 may be used to support printed circuit 38. As shown in FIG. 4, flexible printed circuit 38 may be wrapped around support structure 40 so that conductive foam 36B presses against antenna ground 36A. Support structure 40 may be formed from injection molded plastic or other dielectric material.

The structures of FIG. 4 may be compressed between the front and rear surface of device 10. For example, the front surface of device 10 may be covered with display cover layer 14CG. Display cover layer 14CG may be formed from a sheet of transparent plastic, a sheet of glass, or other transparent dielectric. A layer of opaque masking material such as black ink may be interposed between the inner surface of display cover layer 14CG and components 36C to hide components 36C from view.

When assembled to form the configuration of FIG. 4, conductive foam 36B may be compressed between support structure 40 and grounded components 36C. As a result, any dielectric (air) gaps within the structures that make up antenna ground 36 will be removed. The compression of these structures also biases antenna ground 36A firmly against the top surface of support structure 40 while biasing antenna resonating element structure 34 against the lower surface of support structure 40 and the inner surface of dielectric antenna window structure 22. By compressing the antenna structures against the outsides of support structure 40, the distance D3 between antenna ground 36A and antenna resonating element 34 will be well controlled. The well-controlled magnitude of distance D2, the absence of potentially variable-size air gaps between ground 36A and grounded components 36C, and the absence of potentially variable-size air gaps between antenna resonating element and antenna window 22 may help ensure that antenna 26 performs according to desired specifications. Even if the dimension D1 of components 36C varies due to manufacturing variations, the flexible size (thickness) D2 of conductive foam 36B helps to ensure that a unitary ground element is present that extends from the inner surface of display cover layer 14CG to antenna ground 36A on printed circuit 38. The biasing of support structure 40 and antenna resonating element 34 against window 22 helps ensure that performance variations due to air gap variations between resonating element 34 and antenna window 22 will be negligible.

Figure 5A:
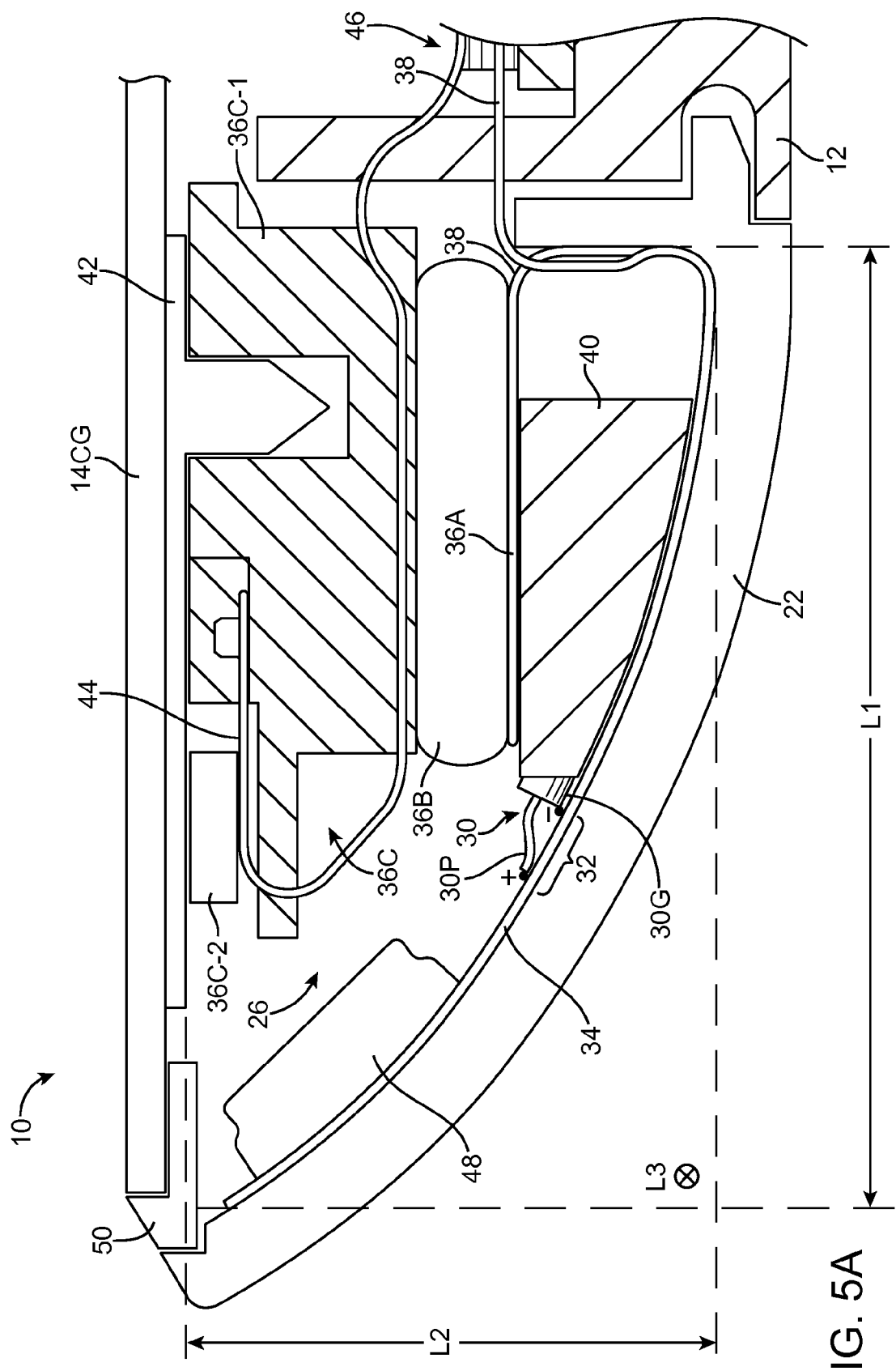
FIG. 5A is a cross-sectional side view of antenna structures and electronic components mounted in an electronic device housing in accordance with an embodiment of the present invention.

FIG. 5A is a cross-sectional side view of an illustrative configuration for device 10 that includes an antenna such as antenna 26 of FIG. 4. As shown in FIG. 5A, antenna 26 may include antenna resonating element 34 and antenna ground structures such as antenna ground structures 36A, 36B, and 36C. Antenna 26 may be mounted in device 10 so that antenna window 22 overlaps antenna 26 and allows radio-frequency antenna signals to pass through antenna window 22 without being blocked by metal housing 12. Components such as microphone 48 may, if desired, be mounted to device 10 on the inner surface of antenna window 22.

Display cover layer 14CG may be mounted to the front face of device 10 using gasket 50. Conductive structures 36C may include metal-shielded (grounded) camera 36C-1 and ambient light sensor 36C-2. Camera 36C-1 may be mounted within device 10 using alignment structure 42 (e.g., a plastic structure). Adhesive may be used to couple the structures of device 10 together. Flex circuit 44 may be used to route signals between electronic components 36C and storage and processing circuitry 46. Storage and processing circuitry 46 may be mounted on one or more printed circuit boards and may include memory, digital signal processing integrated circuits, microprocessors, system-on-chip integrated circuits, and application-specific integrated circuits. Transceiver circuitry such as transceiver circuitry 28 of FIG. 2 may be included in circuitry 46 of FIG. 5A.

Antenna feed 32 may be configured to receive signals from coaxial cable center conductor 30P (at positive antenna feed terminal +) and signals from outer ground coaxial cable conductor 30G (at ground antenna feed terminal −). Flex circuit 38 may contain conductive traces (e.g., metal traces) that form antenna resonating element 34 and antenna ground 36A.

Figure 5B:
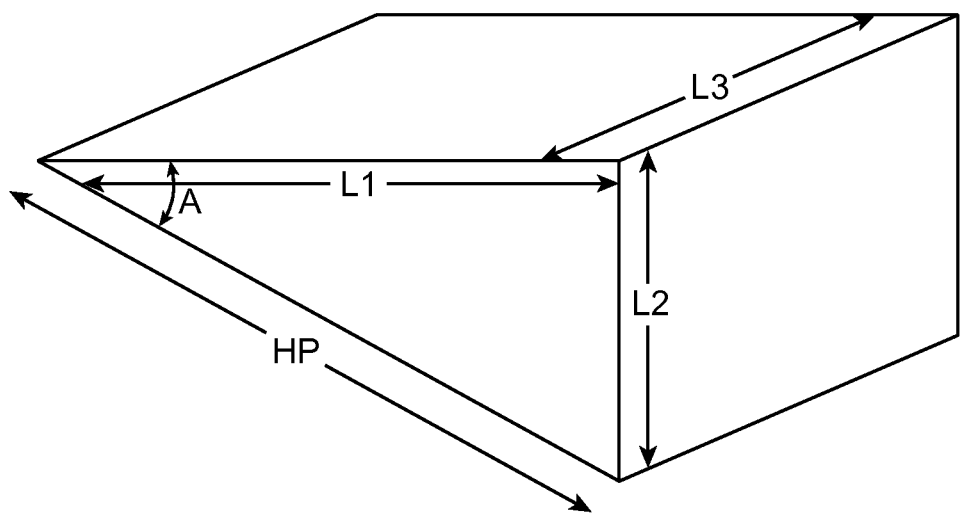
FIG. 5B is a simplified representation of a compact volume in which antenna structures and electronic components may be mounted in an electronic device housing in accordance with an embodiment of the present invention.

The configuration of FIG. 5A allows components such as camera 36C-1, ambient light sensor 36C-2, and antenna 26 (e.g., antenna resonating element 34 and antenna ground 36) and other structures of FIG. 5A such as conductive foam 36B, microphone 48, support structure 40, etc. to be mounted within a compact volume. As shown in FIG. 5A, these components may be mounted within a volume that is characterized by dimensions such as lateral (horizontal) dimension L1, a perpendicular lateral dimension L3 (e.g., a dimension into the page in the example of FIG. 5A), and vertical dimension L2. The magnitude of L1 may be, for example, about 15 mm (e.g., 5 to 45 mm, 10-20 mm, less than 30 mm, or other suitable magnitude). The magnitude of L2 may be, for example, about 8 mm (e.g., 3 to 25 mm, 4 to 16 mm, less than 16 mm, or other suitable magnitude). The magnitude of L3 may be, for example, about 20 mm (e.g., 7 to 60 mm, 10 to 40 mm, less than 40 mm, or other suitable magnitude). FIG. 5B is a simplified perspective view of the illustrative volume within device 10 in which components such as camera 36C-1, ambient light sensor 36C-2, and antenna 26. As shown in FIG. 5B, due to the angled shape of the curved outer surface of window 22, the volume available for mounting components such as camera 36C-1, ambient light sensor 36C-2, and antenna 26 may approximate a triangular prism shape. The prism may have a triangular cross-sectional area with lengths L1, L2, and HP. Angle A may be about 20-50°. The area of the triangular cross-section may be about 60 mm$^2$ (e.g., when L1 is 15 mm and L2 is 8 mm) and the size of the volume shown in FIG. 5B may be about 1200 mm3 (e.g., when L3 is 20 mm). In general, the volume in which components such as camera 36C-1, ambient light sensor 36C-2, and antenna 26 may be mounted may have any suitable size (e.g., 500 to 2000 mm$^3$, less than 2000 mm$^3$, less than 1500 mm$^3$, less than 1200 mm$^3$, less than 1000 mm$^3$, less than 500 mm$^3$, etc.).

Figure 6:
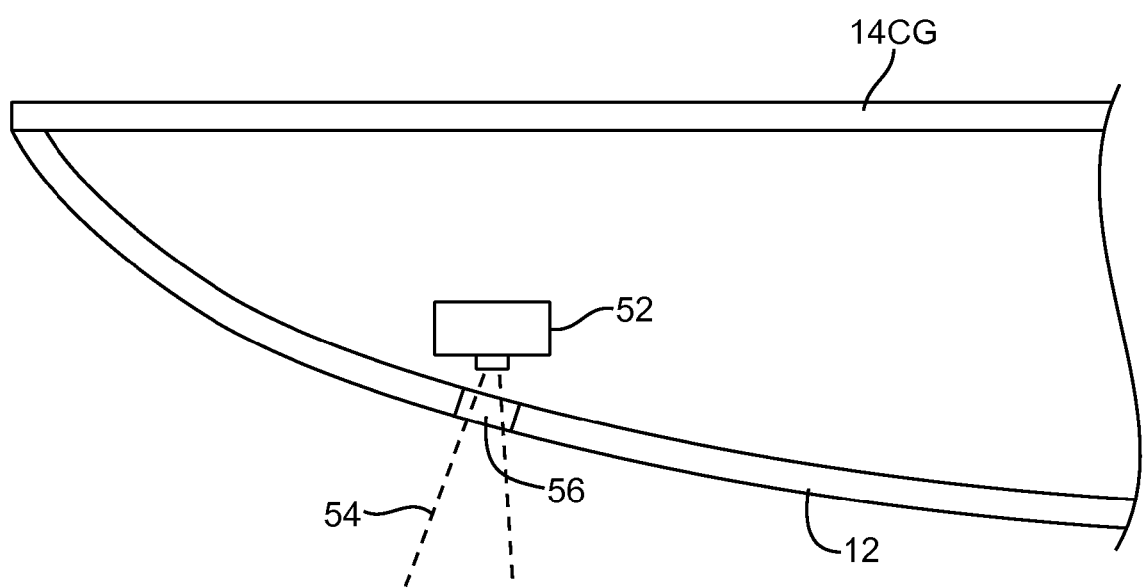
FIG. 6 is a diagram of a camera operating through a camera window mounted within a curved portion of an electronic device housing in accordance with an embodiment of the present invention.

FIG. 6 is a cross-sectional side view of device 10 showing how device 10 may have a camera such as rear-facing camera 52. Transparent camera window 56 may be formed in an opening in housing 12. Transparent camera window 56 may be formed from a transparent material such as clear plastic or glass. During operation of camera 52, camera 52 may receive light from images such as light rays 54 through window 56.

Figure 7:
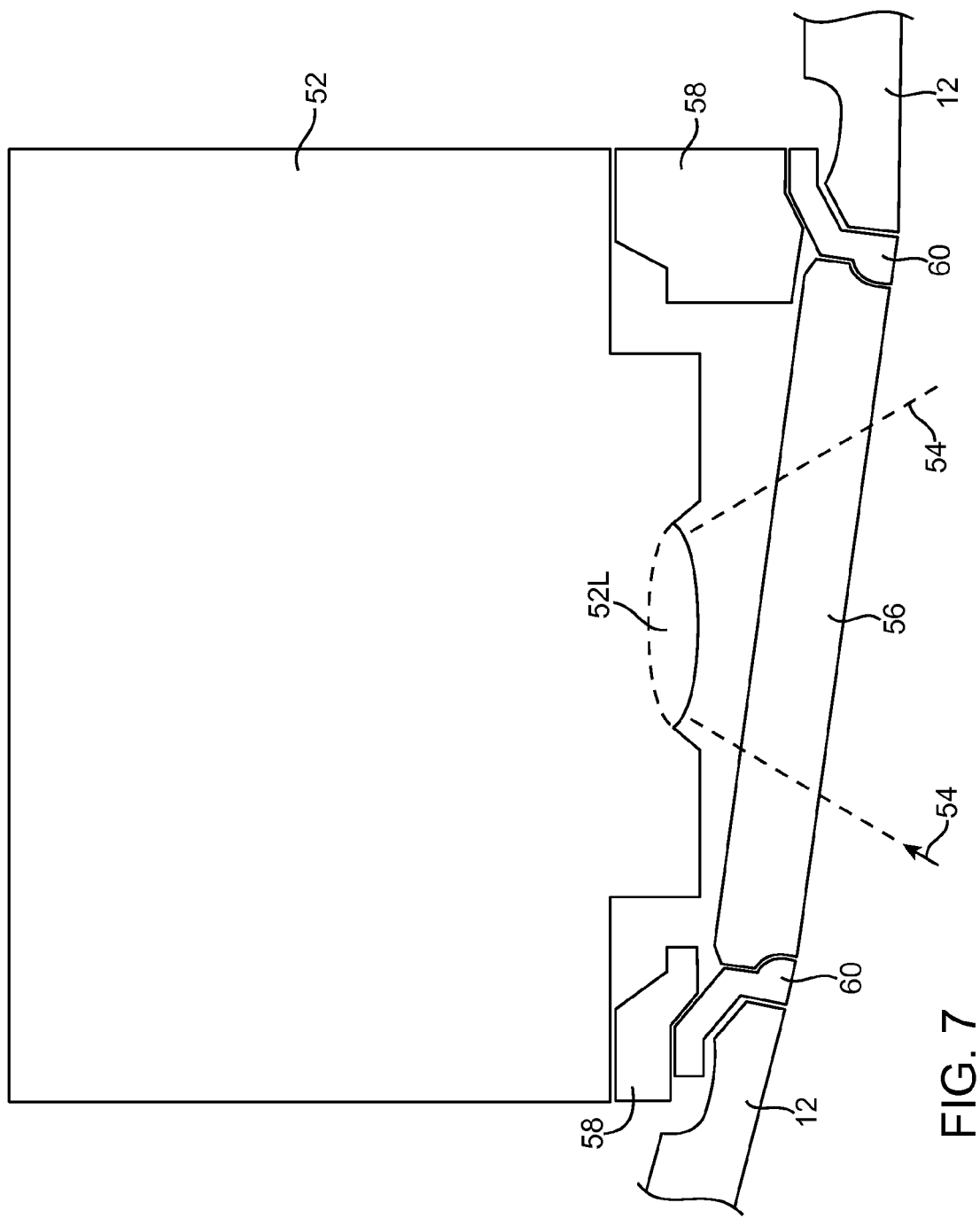
FIG. 7 is a cross-sectional side view of an illustrative electronic device in the vicinity of a camera window in accordance with an embodiment of the present invention.

As shown in FIG. 7, the exterior surface of housing 12 may be curved in the vicinity of window 56. Window structure 56 may be circular, oval, rectangular, or may have other suitable shapes. The opening in housing 12 in which window structure 56 is mounted may have a corresponding circular shape, a corresponding oval shape, a corresponding rectangular shape, or other mating shape. A trim structure such as camera trim structure 60 may surround the periphery (outer edge) of camera window 56 and may be interposed between housing 12 and window 56. The shape of trim structure 60 may be configured to mate with the shapes of the opening of the camera window hole in housing 12 and window 56. For example, if window 56 is circular and the corresponding opening in housing 12 is circular, trim structure 60 may have a circular ring shape. If window 56 has other shapes (e.g., rectangular, oval, etc.), trim 60 may have a corresponding shape (e.g., rectangular, oval, etc.). Trim 60 may be formed from plastic, metal, ceramic, or other suitable materials. For example, trim 60 may be formed from aluminum.

Camera holder structures such as camera holder 58 may be used in mounting camera 52 in device 10 so that camera lens 52L may receive incoming image light 54 through window 56. Camera holder 58 may have a ring shape that surrounds the periphery of camera window 56.

Figure 8:
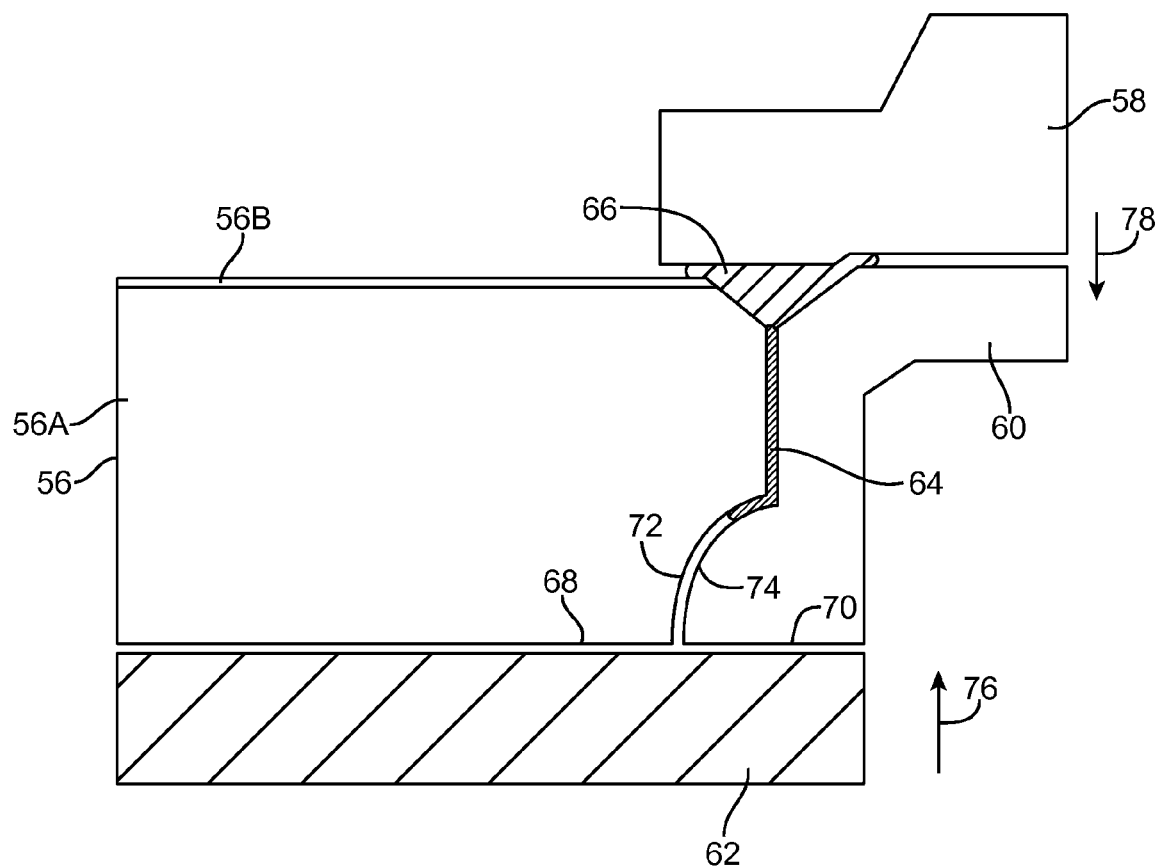
FIG. 8 is a diagram of a portion of a seal formed along the edge of a circular camera window in accordance with an embodiment of the present invention.

A fixture such as fixture 62 of FIG. 8 may be used in assembling camera window 56. As shown in FIG. 8, camera window 56 may have an upper surface with an optical coating such as coating 56B on glass substrate portion 56A. Optical coating 56B may be, for example, an infrared-blocking filter to improve camera performance for camera 52. Opposing exterior surface 68 of camera window 56 may, if desired, be provided with a coating (e.g., an anti-scratch coating, an anti-smudge coating, an anti-reflection coating, etc.). In the illustrative example of FIG. 8, camera window substrate 56A has an uncoated exterior surface.

Due to process variations, there is a risk that exterior surface 68 of camera window 56 may be proud of exterior trim surface 70 of trim 60, particularly in camera window configurations of the type shown in FIG. 8 in which camera window exterior peripheral edge 72 and mating surface 74 of trim 60 have curved shapes. Fixture 62 may be used to ensure that surface 68 and 70 are aligned. In particular, fixture 62 may be pressed upwards in direction 76 during assembly. Pressure from fixture 62 helps align surfaces 68 and 70, as shown in FIG. 8.

Adhesive may be used to secure window 56 relative to trim 60 after alignment with fixture 62. As shown in FIG. 8, multiple types of adhesive may be used in mounting camera window 56. Initially, ultraviolet-light-cured adhesive (UV adhesive) 64 may be used to secure the position of camera window 56 relative to trim 60. After adhesive 64 has been cured to hold window 56 in place, additional adhesive such as hot melt adhesive 66 may be applied. Hot melt adhesive 66 may be a glue that is liquid at elevated temperatures (i.e., temperatures above room temperature) and that solidifies upon cooling to room temperature. To create a satisfactory seal between camera holder 58 and camera window 56, camera holder 58 may be pressed downwards in direction 78 while adhesive 66 is in its molten state.

Adhesives 66 and 64 may have different mechanical properties. For example, adhesive 66 may be more flexible and able to withstand damage due to sharp impacts than adhesive 64. The presence of adhesive 66 may therefore help to ensure that the seal formed between camera window 56 and camera holder 58 and trim 60 is able to withstand damage from unintended drop events and other impact events. Adhesive 66 may help prevent adhesive 64 from cracking and, in the event that adhesive 64 develops a crack, may serve as a redundant sealing structure for window 56.

Figure 9:
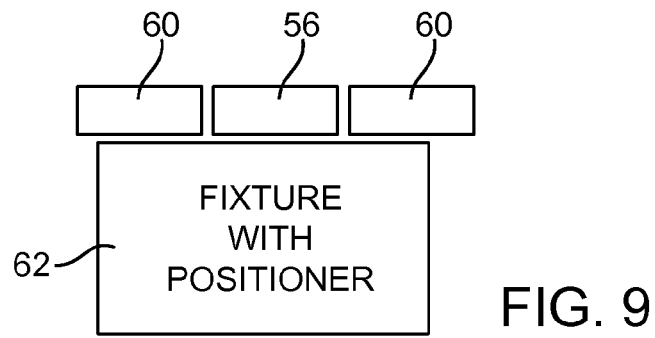
FIG. 9 is a diagram of an illustrative camera window mounting fixture in accordance with an embodiment of the present invention.

Equipment that may be used in forming camera window 56 is shown in FIGS. 9, 10, 11, and 12. As shown in FIG. 9, a computer-controlled fixture such as fixture 62 (i.e., a fixture with a computer-controlled positioner) may be used in positioning camera window 56 relative to other device structures such as trim 60 and housing 12 of FIG. 1. If desired, a manually-operated fixture may be used in assembling camera window 56.

Figure 10:
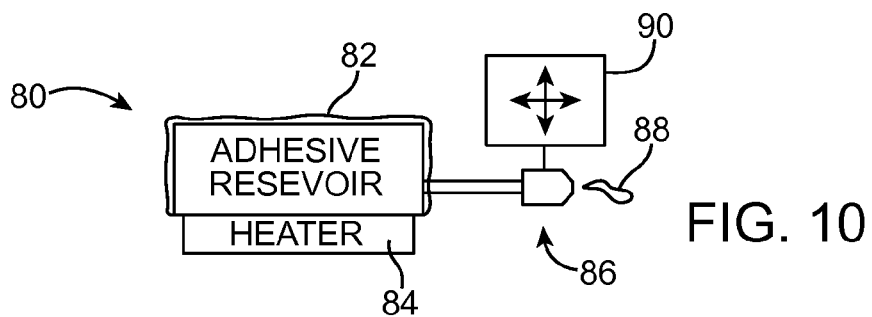
FIG. 10 is a diagram of illustrative adhesive-dispensing equipment that may be used in mounting a camera window to an electronic device in accordance with an embodiment of the present invention.

Adhesive dispensing equipment 80 of FIG. 10 may be used to dispense adhesive 88 such as adhesive 64 and/or adhesive 66 of FIG. 8. As shown in FIG. 10, adhesive dispensing equipment 80 may include an adhesive reservoir such as adhesive reservoir 82 coupled to dispensing nozzle 86. The position of nozzle 86 may be controlled manually or using computer-controlled positioner 90. When dispensing hot melt adhesive, heater 84 may be used to heat the adhesive prior to application.

Figure 11:
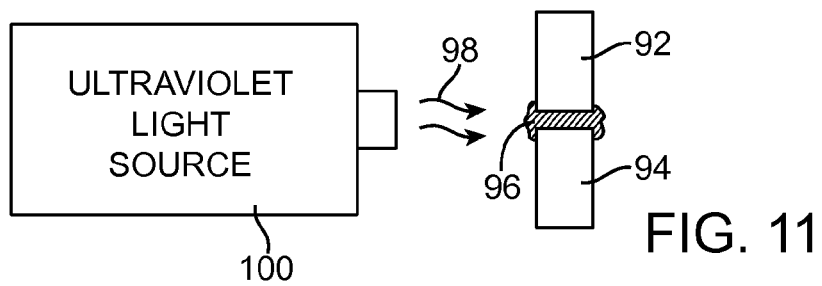
FIG. 11 is a diagram of an ultraviolet light source that may be used in curing ultraviolet light adhesive in accordance with an embodiment of the present invention.

Ultraviolet-light-curing adhesive such as adhesive 64 of FIG. 8 may be cured by application of ultraviolet light. Illustrative equipment that may be used for curing ultraviolet-light-curing adhesive is shown in FIG. 11. As shown in FIG. 11, ultraviolet light source 100 may produce ultraviolet light 98. Ultraviolet light source 100 may be an ultraviolet lamp, a light-emitting diode that produces ultraviolet light, or a laser that produces ultraviolet light. Light 98 may cure ultraviolet-light-curing adhesive 96 to attach structures 92 and 94 to each other.

Figure 12:
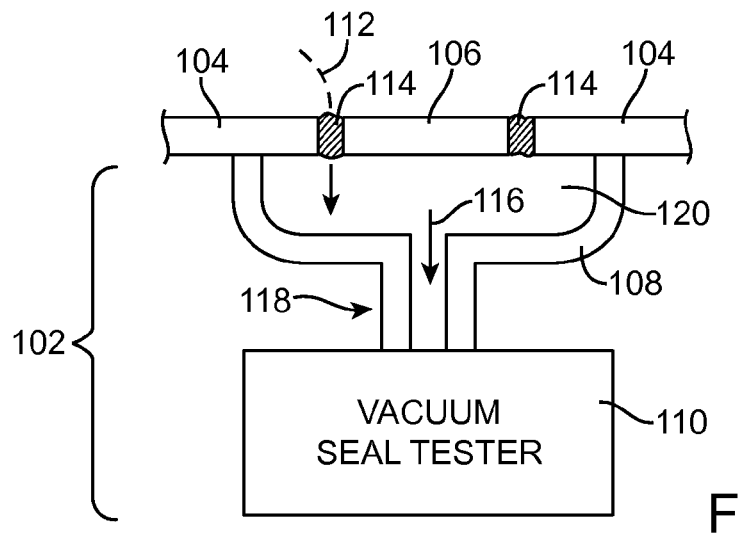
FIG. 12 is a diagram of illustrative vacuum-based seal testing equipment that may be used in testing how well a camera window or other structure has been mounted within an electronic device housing sidewall in accordance with an embodiment of the present invention.

FIG. 12 shows how a seal that has been formed around camera window structures or other structures that have been attached to each other using adhesive may be tested using vacuum testing equipment 102. In the example of FIG. 12, structures 104 and 106 have been attached using adhesive 114. Adhesive 114 may include ultraviolet-light cured adhesive, hot melt adhesive and/or other adhesives. By attaching structure 106 in an opening formed in structure 104 with adhesive 114, a seal is formed between structure 104 and 106. Structure 104 may be, for example, a structure such as camera window 56 and structure 106 may be, for example, a structure such as trim 60.

Vacuum test equipment 102 may include a vacuum seal tester such as vacuum seal tester 110 and an associated structure for applying vacuum over the seal to be tested such as vacuum application structure 108. During testing, tester 110 may create a vacuum. The vacuum may cause air 116 to be evacuated from interior portion 120 of structure 108 via outlet 118. When all air has been evacuated from interior portion 120, tester 110 can evaluate the quality of the vacuum in interior portion 120. If the seal formed by adhesive 114 is satisfactory, the rate at which air enters interior portion 120 will be negligible. If, however, the seal is not satisfactory, leaking air 112 may cause the air pressure within interior portion 120 to rise. By measuring the quality of the vacuum that is produced within interior portion 120, tester 110 may determine whether or not the seal formed by adhesive 114 is acceptable for use in device 10. If the seal is not satisfactory, device 10 can be repaired or scrapped.

Figure 13:
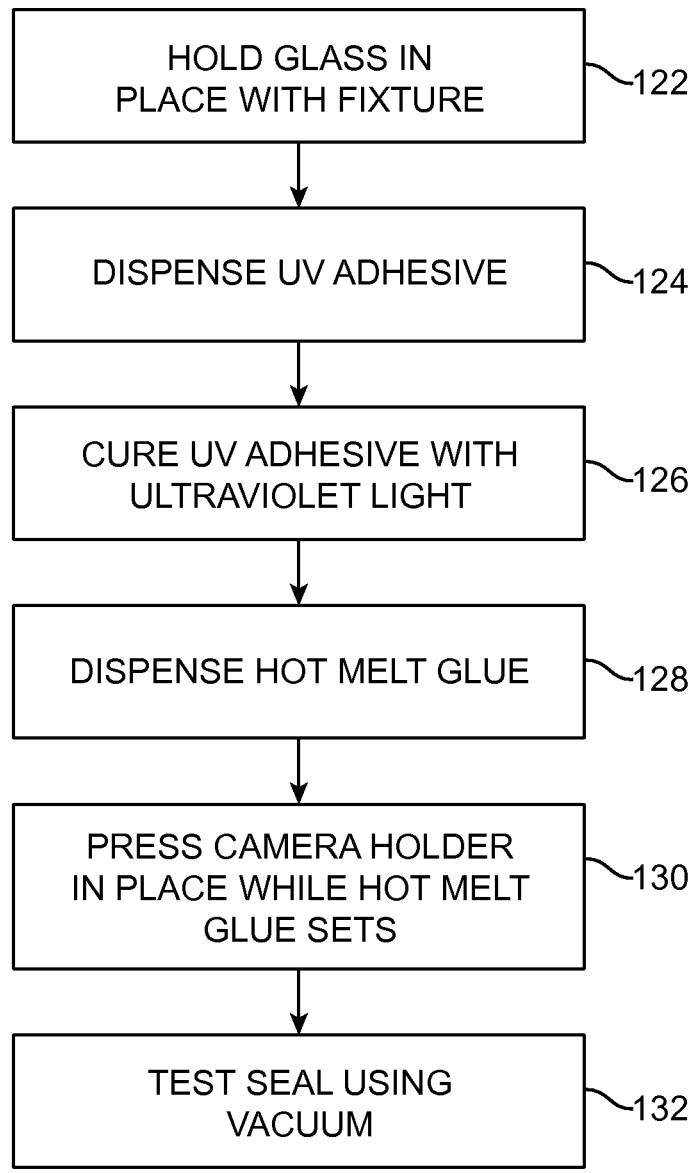
FIG. 13 is a flow chart of illustrative steps involved in mounting an electronic component such as an electronic device within an electronic device housing in accordance with an embodiment of the present invention.

FIG. 13 is a flow chart of illustrative steps involved in forming a camera window for device 10. At step 122, equipment such as fixture 62 of FIG. 9 may be used to hold window 56 and trim 60 in place. By using fixture 62, the relative position of window 56 relative to trim 60 may be controlled, thereby avoiding undesirable configurations in which surface 68 of window 56 is proud of surface 70 of trim 60.

At step 124, while the position of window 56 relative to trim 60 is being controlled by fixture 62, adhesive dispensing equipment 80 of FIG. 10 may be used to dispense ultraviolet-light-cured adhesive 64 into the gap formed between trim 60 and window 56.

At step 126, ultraviolet light source 110 may be used to apply ultraviolet light 98 to adhesive 64. This cures adhesive 64 and secures window 56 relative to trim 60.

At step 128, adhesive dispensing equipment 80 of FIG. 10 may be used to dispense hot melt adhesive 66. As shown in FIG. 8, adhesive 66 may fill the remaining gap between window 56 and trim 60 and may abut adhesive 64. While the hot melt adhesive is still in its molten state, a computer-controlled fixture such as fixture 62 of FIG. 9 or other computer-controlled or manually controlled equipment may be used to press camera holding structure 58 downwards on adhesive 66 in direction 78 (FIG. 8). Camera holding structure 58 may be held in the position of FIG. 8 until hot melt adhesive 66 cools and sets.

After window 56 has been mounted to device 10 in this way, vacuum seal testing equipment 102 of FIG. 12 may be used to test the seal between window 56 and device 10 (e.g., the seal formed by adhesives 64 and 66). If the seal is not satisfactory, device 10 can be repaired or discarded.

Figure 14:
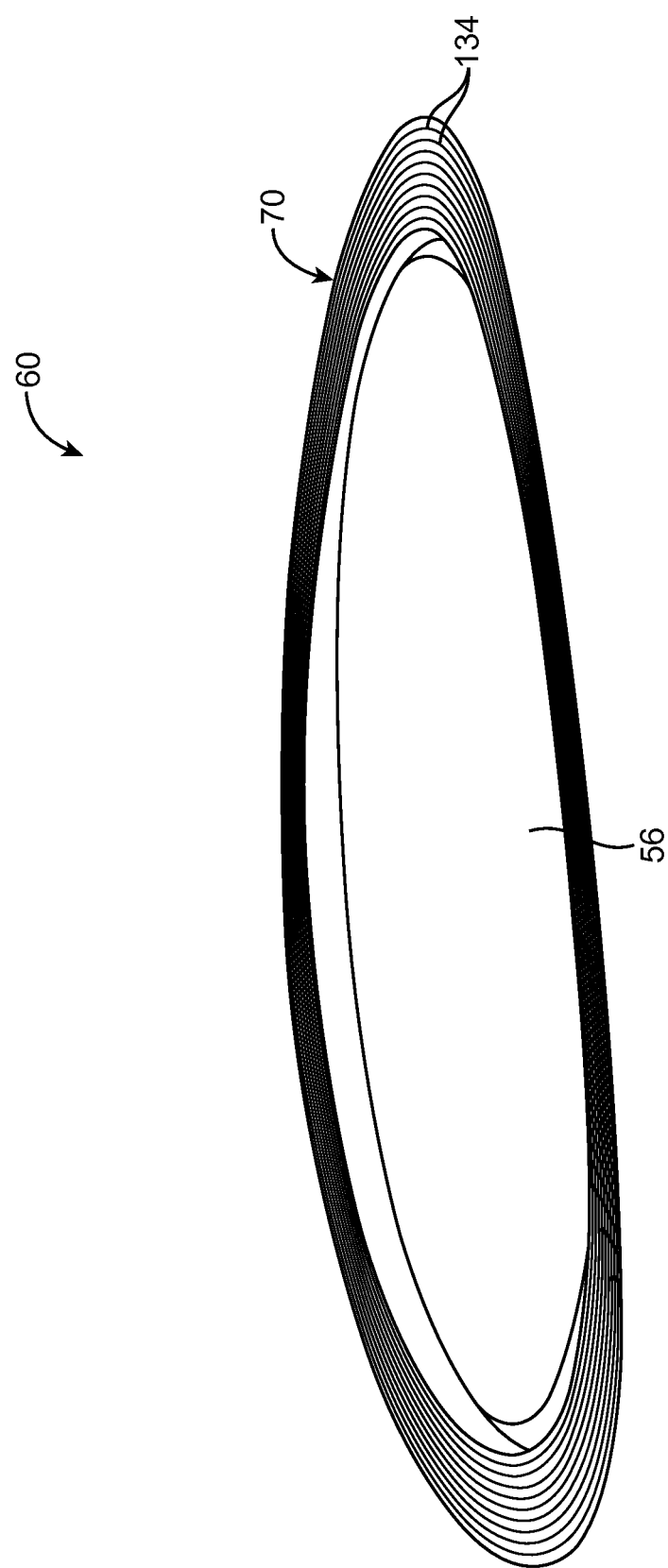
FIG. 14 is a perspective view of an illustrative camera window having associated grooved camera window trim structures in accordance with an embodiment of the present invention.

It may be desirable to provide exterior surface 70 of trim 60 with grooves or other features (e.g., to enhance device aesthetics), as shown in FIG. 14. When mounting camera window 56 in a portion of housing 12 that contains a curved surface, it may be desirable to provide trim 60 with a matching curved shape of the type shown in FIG. 14.

Figure 15:
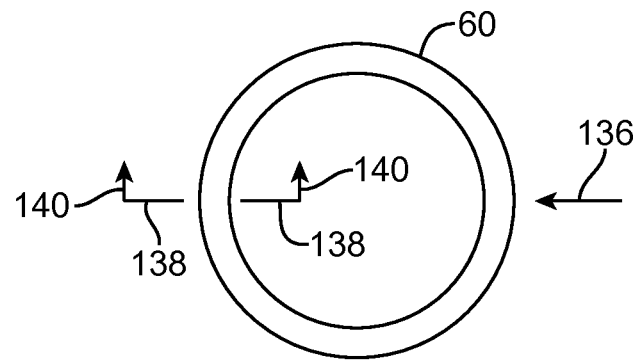
FIG. 15 is a top view of an illustrative camera window trim ring in accordance with an embodiment of the present invention.
Figure 16:
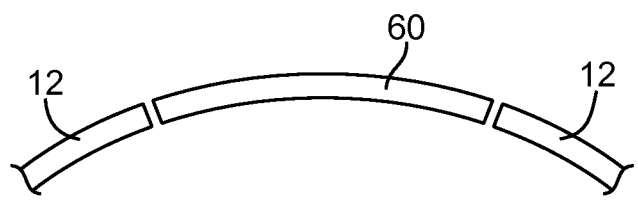
FIG. 16 is a side view of a camera window trim mounted in a curved portion of an electronic device housing sidewall in accordance with an embodiment of the present invention.

FIG. 15 is a top view of trim 60, showing how trim 60 may have a circular ring shape. FIG. 16 is a side view of trim 60 viewed in direction 136 of FIG. 15 in a configuration in which trim 60 has been mounted within a portion of housing 12 with a curved surface. As shown in FIG. 16, the curved surface shape of trim 60 may be configured to match the curved surface shape of housing 12.

Figure 17:
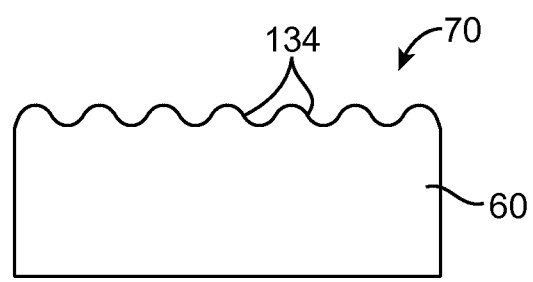
FIG. 17 is a cross-sectional side view of a portion of a grooved camera trim ring in accordance with an embodiment of the present invention.

FIG. 17 is a cross-sectional view of a portion of trim 60 taken along line 138 of FIG. 15 and viewed in direction 140. As shown in FIG. 17, exterior surface 70 of trim 60 may have grooves 134. Grooves 134 may have a wavy (e.g., sinusoidal) profile, a triangular profile, a square profile or other suitable shape. Trim 60 may be formed form a material such as metal (e.g., aluminum) and the shape and surface of trim 60 may be formed using machining techniques.

Figure 18:
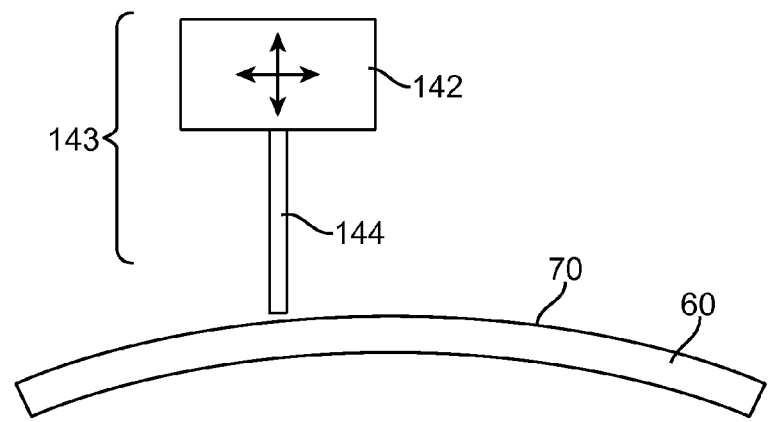
FIG. 18 is a diagram of illustrative computer-controlled milling tool being used to machine a camera window trim member of the type shown in FIG. 14 in accordance with an embodiment of the present invention.

FIG. 18 is a diagram of illustrative computer-controlled milling equipment that may be used in forming grooves 134 of FIG. 17. As shown in FIG. 18, equipment 143 (e.g., a computer numerical control machine tool) may include computer-controlled positioner 142 to control the position of milling (grinding) head 144. Using computer control, head 144 may trace out a pattern of grooves 134 following curved exterior surface 70 of trim 60.

Figure 19:
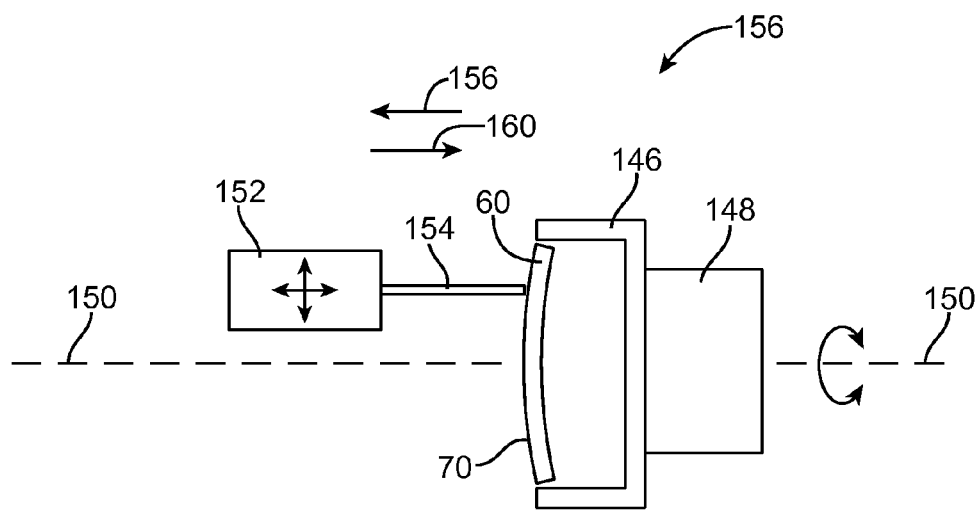
FIG. 19 is a diagram of illustrative lathe being used to form a camera window trim member of the type shown in FIG. 14 in accordance with an embodiment of the present invention.

If desired, a lathe may be used in forming grooves 134. As shown in FIG. 19, lathe equipment 156 may include a holder such as holder 146 for holding trim 60 during lathing operations. Rotator 148 may be used in rotating holder 146 and trim 60 about rotational axis 150. While trim 60 is being rotated about axis 150, computer-controlled positioner 152 may move lathe head 154 laterally in directions 156 and 160 in a pulsing fashion to create grooves 134 on curved surface 70.

Device 10 may contain flexible printed circuit ("flex circuit") structures formed from sheets of polyimide or other polymers. Metal traces on the flexible printed circuits may be used to form signal buses. Flex circuit signal cables that contain signal buses may be relatively compact and can have numerous parallel signal traces for carrying relatively large number of signals, if desired.

It may be desirable to use a flexible printed circuit cable ("flex circuit cable") to couple portions of device 10 that move relative to each other during assembly or disassembly. As an example, one end of a flex circuit cable may be attached to a printed circuit board and the other end of the flex circuit cable may be attached to a display or other component. During manufacturing operations or during disassembly to repair a device, it may be necessary to move the display relative to the printed circuit board. The flex circuit cable may be provided with an additional length such as a folded portion to accommodate relative movement between these two components without need to disconnect the flex circuit cable. This type of additional length of flex circuit cable may sometimes be referred to as a service loop.

To prevent a flex circuit cable with a service loop from becoming tangled, the service loop may be provided with a service loop band that gathers together segments of the flex circuit cable. The service loop band serves as a cable management structure that prevents excessive lengths of the flex circuit cable from becoming caught on components in device 10 as device 10 is assembled and disassembled.

Figure 20:
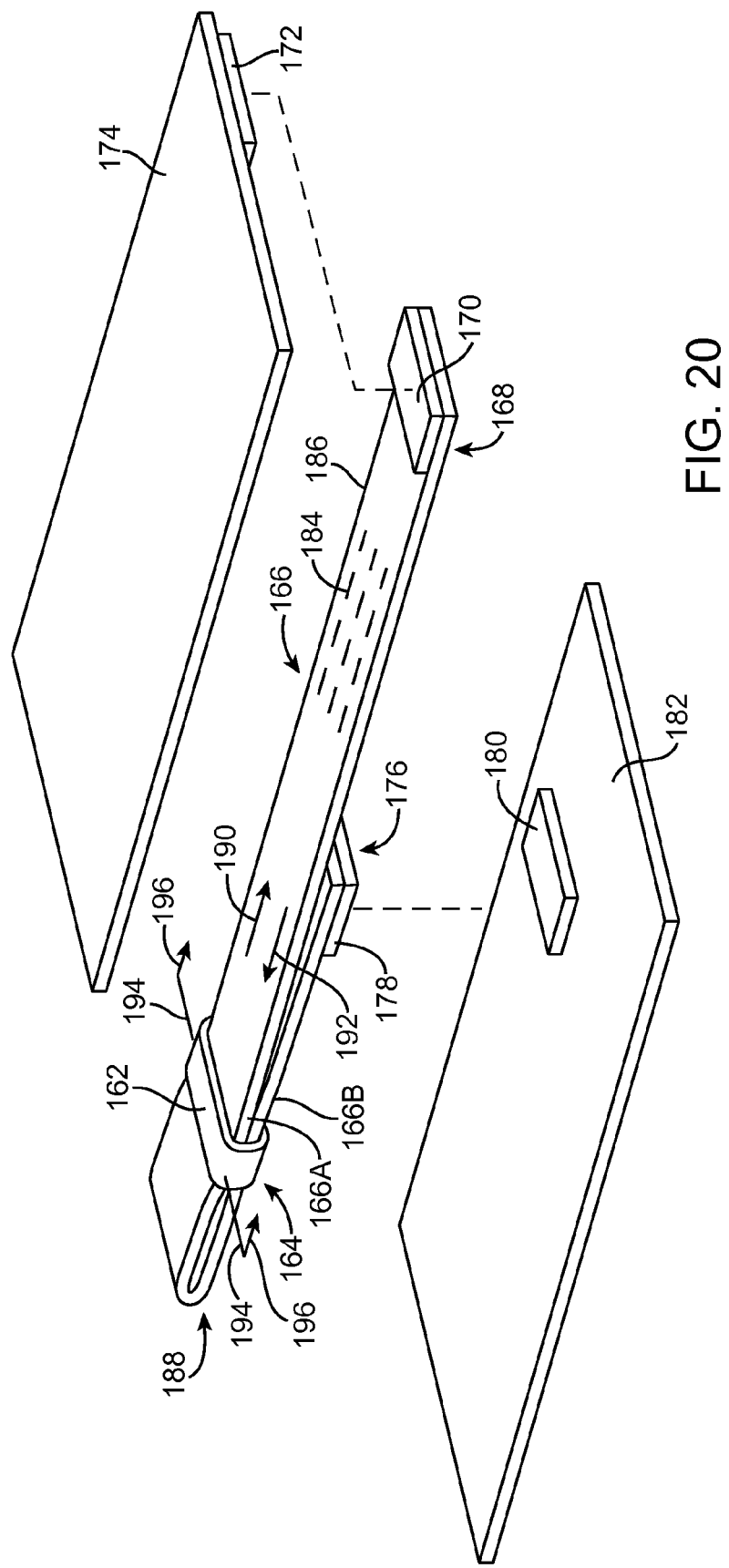
FIG. 20 is an exploded perspective view of a system in which a flexible printed circuit cable that has been folded has been provided with a retention band to form a service loop in accordance with an embodiment of the present invention.

An illustrative service loop band configuration that may be used for a flex circuit cable is shown in FIG. 20. As shown in the flexible printed circuit cable assembly of FIG. 20, flex circuit cable 166 may contain parallel conductive traces 184 (e.g., metal traces) and substrate 186. Substrate 186 may be formed from a flexible polymer layer such as a ribbon-shaped strip of polyimide.

Flex circuit cable 166 may have opposing first and second ends. End 168 may have a connector such as connector 170 that is adapted to mate with connector 172 on component 174. End 176 may have a connector such as connector 178 that is adapted to mate with connector 180 on component 182. Components 182 and 174 may be structures such as a printed circuit board that is populated with one or more integrated circuits, a display, an audio component, or other components of device 10. If desired, solder connections or connections formed from conductive adhesive may be used in place of connectors 170, 172, 176, and 180. The arrangement of FIG. 20 is merely illustrative.

As shown in FIG. 20, flex circuit cable 166 may have one or more bends such as bend 188. Due to the presence of bend 188, flex circuit 166 may be folded back on itself in folded region 164 to form a service loop. The service loop includes upper flex circuit cable layer 166A and lower flex circuit cable layer 166B. To manage cable 166, cable 166 may be provided with one or more band structures such as band 162. Band 162 may surround folded flex circuit cable 166 so that layers 166A and 166B are held together as shown in FIG. 20. Band 162 may be configured to allow the length of flex circuit cable 166 within the service loop to change when tension is placed on cable 166 (i.e., band 162 may allow layer 166A and/or layer 166B to slip longitudinally under band 162 in directions 190 and/or 192 as needed).

FIGS. 21, 22, 23, and 24 are cross-sectional end views of cable 166 taken along line 194 and viewed in direction 196 of FIG. 20. Band structure 162 may be formed from an elastomeric polymer or other suitable material.

Figure 21:
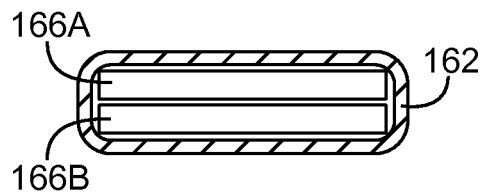
FIG. 21 is a cross-sectional end view of an illustrative folded flexible printed circuit surrounded by a retention band in accordance with an embodiment of the present invention.

In the illustrative configuration of FIG. 21, the band 162 is substantially free of adhesive. Because the inner surface of the loop-shaped band structure that forms band 162 is free of adhesive, both layer 166A and layer 166B of flex circuit cable 166 can move relative to band 162.

This movement allows the length of the service loop that is formed in the flex circuit cable to vary to accommodate movement of parts during assembly and disassembly operations. Band 162 of FIG. 21 may be, for example, an elastomeric loop.

Figure 22:
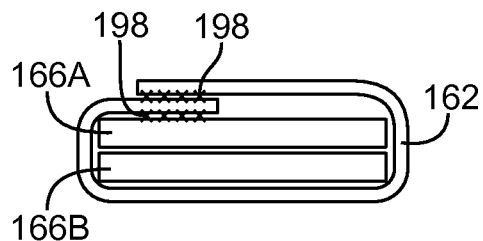
FIGS. 22, 23, and 24 are cross-sectional end views of an illustrative folded flexible printed circuit surrounded by a retention band formed from overlapping tape structures in accordance with an embodiment of the present invention.

In the illustrative configuration of FIG. 22, band structure 162 has been formed from a strip of polymer. Two layers of adhesive 198 have been used to attach band 162 to itself and to the upper surface of flex circuit cable layer 166A. Upper layer 166A is attached to the inner surface of band 162 by adhesive 198, but lower layer 166B is not attached to band 162 by adhesive 198 and is therefore free to move relative to band 162 when the length of the service loop is adjusted.

Figure 23:
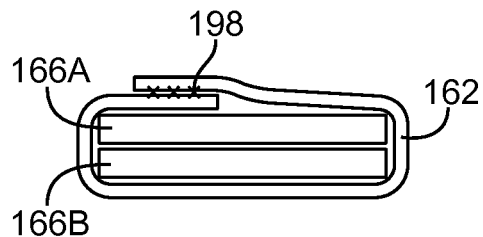

In the illustrative configuration of FIG. 23, band structure 162 has been formed from a strip of polymer that is attached to itself with adhesive 198, but which does not have any adhesive to attach band structure 162 to flex circuit cable layers 166A and 166B. With this type of configuration, both layers 166A and 166B may slide within band 162 as the size of the service loop in the flex circuit cable is adjusted.

Figure 24:
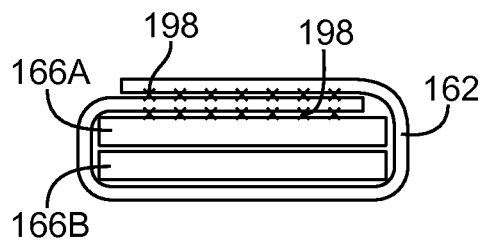

The arrangement of FIG. 24 uses two layers of adhesive 198 and includes more overlapping area between the ends of band structure 162 than the illustrative configuration of FIG. 22. The upper (exterior) surface of layer 166A is attached to the inner surface of band 162 by adhesive 198 and therefore does not slide relative to band 162. Layer 166B is not, however, attached to band 162 by adhesive so that layer 166A may slide within band 162 as the size of the service loop in the flex circuit cable is adjusted.

The configurations of FIGS. 21, 22, 23, and 24 are merely illustrative. Other suitable band-shaped structure may be used to retain folded flex circuit cable structures in device 10, if desired.

Figure 25:
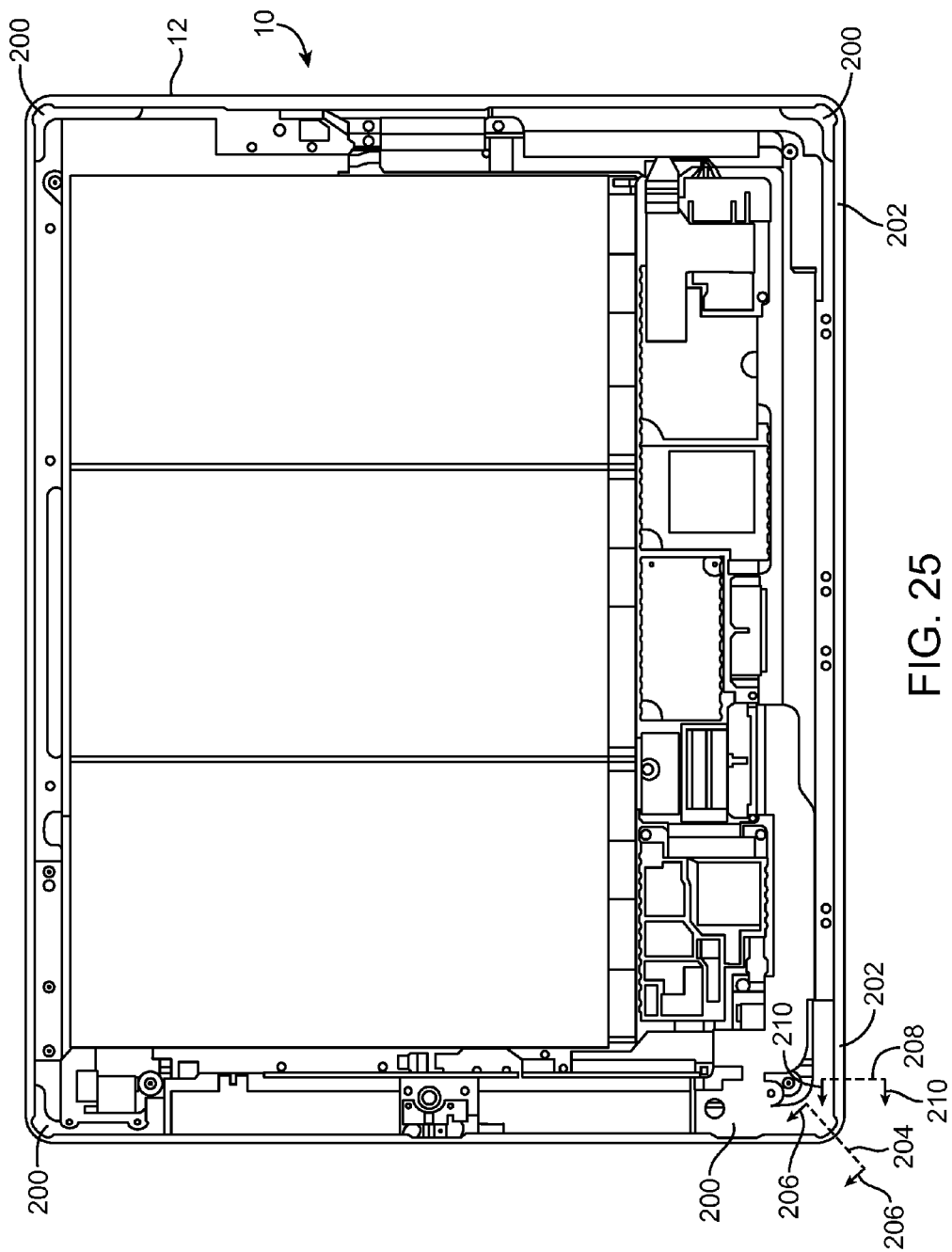
FIG. 25 is a top interior view of an electronic device of the type shown in FIG. 1 in accordance with an embodiment of the present invention.

FIG. 25 is a top interior view of an electronic device such as device 10 of FIG. 1. In the configuration of FIG. 25, display cover layer 14CG (FIG. 4) is not present, so interior components in housing 12 are visible. As shown in FIG. 25, corner brackets 200 may be provided at each of the four corners of housing 12 to help strengthen device 10 and support display cover layer 14CG. Corner brackets 200 may be formed from a metal such as stainless steel, other metals, or other materials. An elastomeric gasket such as gasket 202 may run along the peripheral edge of device housing 12. Gasket 202 may have a rectangular ring shape for receiving a rectangular display cover layer such as display cover layer 14CG. When installed in device 10, gasket 202 may be interposed between display cover layer 14CG and the walls of housing 12.

Gasket 202 may be formed from an elastomeric material such as a flexible polymer. As an example, gasket 202 may be formed from polycarbonate (PC), acrylonitrile butadiene styrene (ABS), a PC/ABS blend, silicone, polyamide, butyl rubber, polyurethane, or other suitable gasket material. Gasket 202 need not have a uniform width (later dimension in the page of FIG. 25). For example, gasket 202 may have a narrowed width at the corners of housing 12. This narrowed width may allow corner brackets 200 to be locally enlarged to enhance strength.

Figure 26:
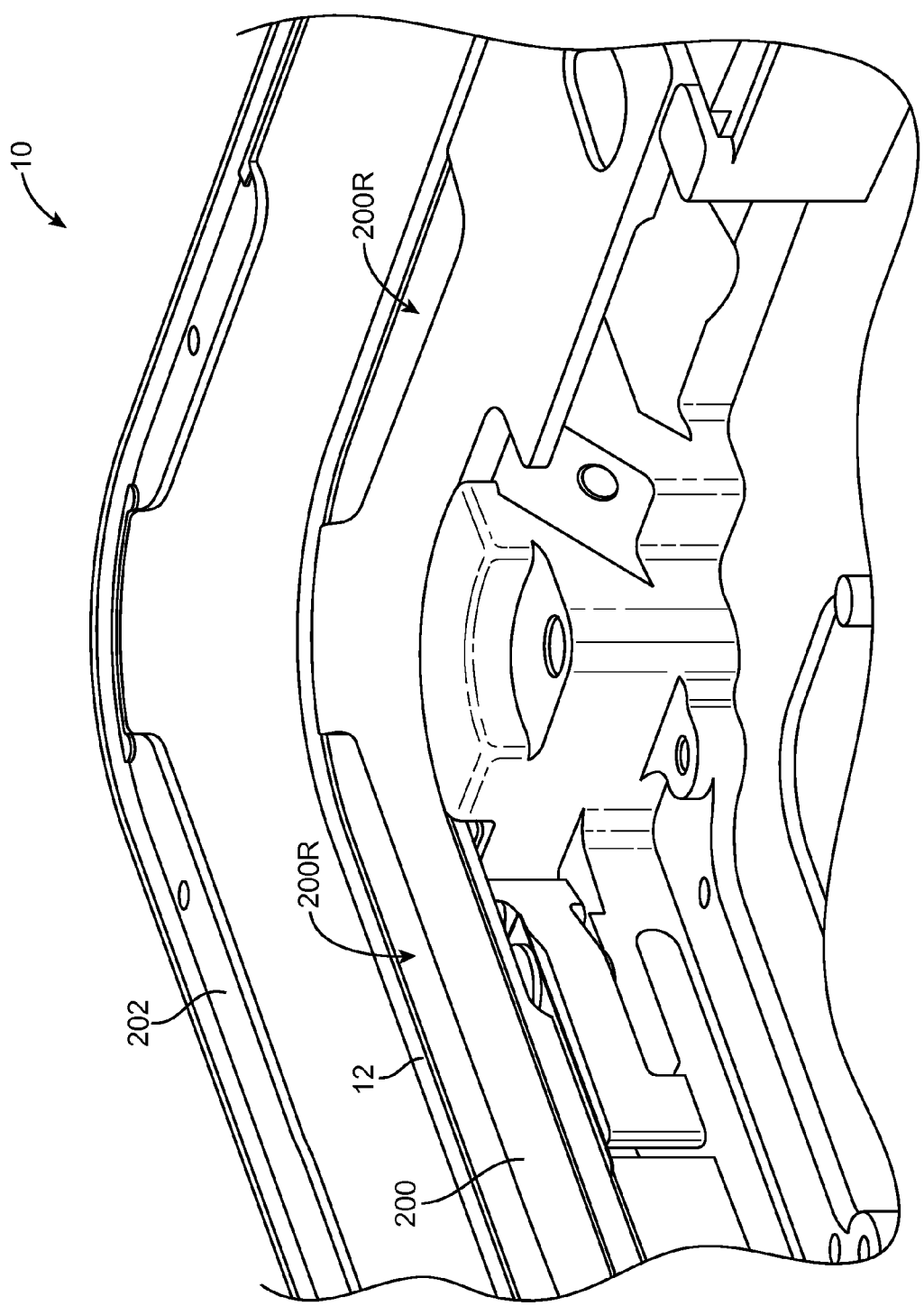
FIG. 26 is an exploded perspective view of a corner portion of an electronic device in accordance with an embodiment of the present invention.

FIG. 26 is an exploded perspective view of a corner portion of electronic device 10 showing how gasket 202 may have portions that are configured to fit within recessed portions 200R of bracket 200. As shown in FIG. 26, some portions of gasket 202 are wider than others. In the FIG. 26 example, the corner of gasket 202 is narrower than adjacent edge portions of gasket 202. Bracket 200 may have recessed portions such as recesses 200R. The size and shape of recesses 200R may be configured to receive mating portions of gasket 202.

Figure 27:
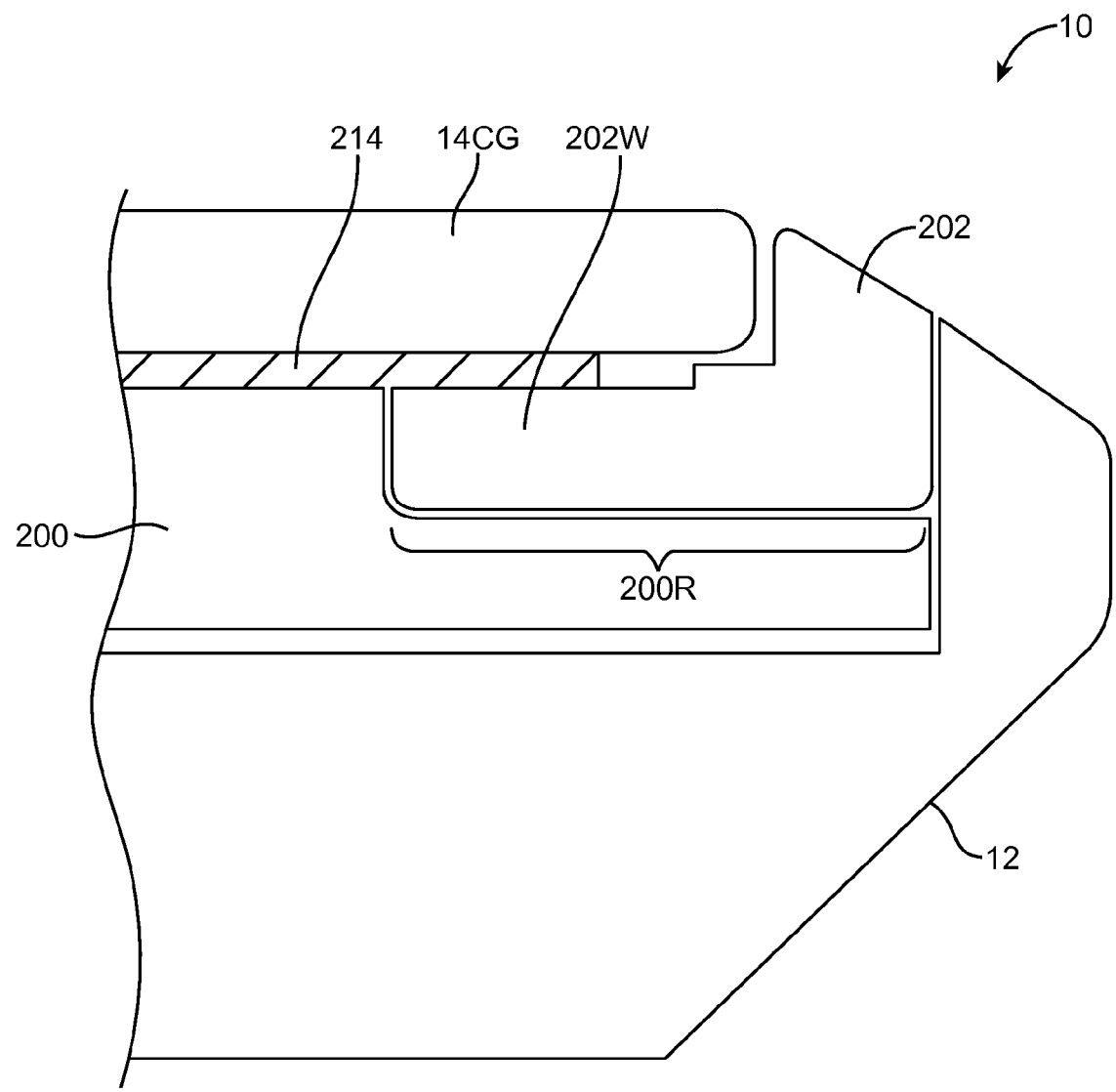
FIG. 27 is a cross-sectional side view of an illustrative electronic device in the vicinity of a corner of the device in accordance with an embodiment of the present invention.

A cross-sectional side view of device 10 of FIG. 25 taken along line 208 of FIG. 25 and viewed in direction 210 is shown in FIG. 27. Along line 208, gasket 202 may have an L-shaped cross section. As shown in FIG. 27, corner bracket 200 may have a removed portion (e.g., a recess) such as removed portion 200R to accommodate widened portion 202W of L-shaped gasket 202. Adhesive 214 such as pressure sensitive adhesive (PSA) may be used to attach display cover layer 14CG to bracket 200.

Figure 28:
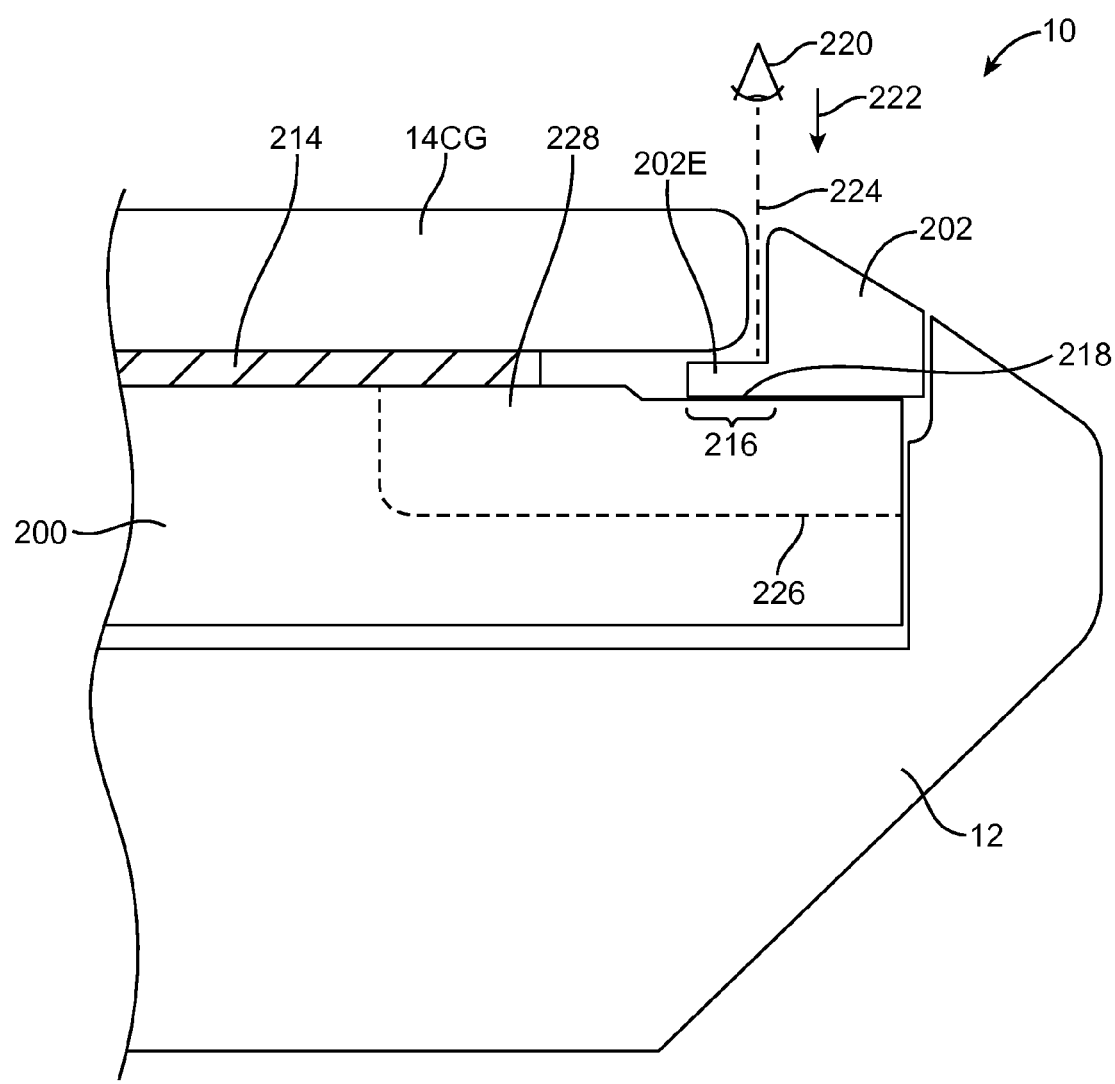
FIG. 28 is a cross-sectional side view of an illustrative electronic device at a corner of the device in accordance with an embodiment of the present invention.

A cross-sectional side view of device 10 of FIG. 25 taken along line 204 and viewed in direction 206 is shown in FIG. 28. As shown in FIG. 28, in this non-recessed portion of corner bracket 200, corner bracket 200 may have material 228 in region 226 (i.e., recess 200R of FIG. 27 may be filled in with corner bracket material at the corner of device 10). The presence of material 228 in region 226 of bracket 200 may help locally strengthen bracket 200, but may give rise to a risk that bracket 200 will be visible to a user of device 10.

As shown in FIG. 28, gasket 202 may be provided with an extended portion such as portion 202E that covers portion 218 of bracket 220 in region 216. Extended portion 202E may provide gasket 202 with an L-shaped cross section. A gap may laterally separate the outer peripheral edge of display cover layer 14CG from an opposing inner peripheral edge of rectangular ring-shaped gasket 202. Extended portion 202E of gasket 202 may extend under the edge of display cover layer 14CG. When extended portion 202E overlaps the gap between display cover layer 14CG and gasket 202 in this way, extended portion 202E can block portion 218 of bracket 200 from view in direction 222 along line 224 by viewer 220. Accordingly, bracket 200 will be hidden from view from the exterior of device 10, even in the presence of a gap between the outer edge of cover glass 14CG and the opposing inner edge of gasket 202.

The foregoing is merely illustrative of the principles of this invention and various modifications can be made by those skilled in the art without departing from the scope and spirit of the invention.

What is claimed is:

1. An electronic device, comprising:
   a dielectric structure;
   a support structure;
   a flexible printed circuit that is wrapped around the support structure and that includes conductive traces that form an antenna ground and an antenna resonating element in an antenna; and
   a conductive foam structure that presses against the antenna ground and that pushes the support structure and the antenna resonating element against the dielectric structure.

2. The electronic device defined in claim 1 further comprising a conductive housing, wherein the dielectric structure is configured to form an antenna window in the conductive housing.

3. The electronic device defined in claim 2 further comprises an electronic component, wherein the conductive foam structure is compressed between the electronic component and the antenna ground.

4. The electronic device defined in claim 3 wherein the electronic component comprises a camera.

5. The electronic device defined in claim 4 further comprising a display cover layer mounted on a front surface of the conductive housing, wherein the camera, the conductive foam structure, the support structure, and the flexible printed circuit that is wrapped around the support structure are compressed between the display cover layer and the antenna window.

6. The electronic device defined in claim 5 wherein the camera, the conductive foam structure, and the flexible printed circuit are configured to occupy a volume of less than 2000 mm$^3$.

7. The electronic device defined in claim 1 wherein the antenna ground and antenna resonating element are configured so that the antenna operates in a satellite navigation system band.

8. The electronic device defined in claim 1 further comprising at least one electrical component that presses against the conductive foam.

9. The electronic device defined in claim 8 wherein the at least one electrical component includes a camera.

10. The electronic device defined in claim 8 wherein the at least one electrical component includes a light sensor.

11. The electronic device defined in claim 1 further comprising:
    a conductive housing in which the dielectric structure serves as an antenna window for the antenna, wherein the conductive housing has a curved surface; and
    a camera window mounted in the curved surface.

12. Apparatus, comprising:
    an electronic device housing;
    a camera in the electronic device housing;
    a camera window trim structure mounted in an opening in the housing;
    first and second adhesives of different types; and
    a camera window that is mounted in the camera window trim structure with the first and second adhesives.

13. The apparatus defined in claim 12 wherein the first adhesive comprises ultraviolet-light-curing adhesive and wherein the second adhesive comprises hot melt adhesive.

14. The apparatus defined in claim 13 wherein the ultraviolet-light-curing adhesive and the hot melt adhesive form a seal between the camera window trim structure and the camera window.

15. The apparatus defined in claim 14 wherein the electronic device housing has a curved surface and wherein the camera window trim structure has a curved exterior surface that matches curved surface of the electronic device housing.

16. The apparatus defined in claim 15 wherein the camera window trim structure has grooves on the curved exterior surface.

17. An electronic device, comprising:
    a housing having a rectangular periphery and four corners;
    four corner brackets, each corner bracket being located in a respective corner of the housing;
    a rectangular display cover layer; and
    a rectangular ring-shaped gasket that runs around the rectangular periphery and that is interposed between the display cover layer and the four corner brackets, wherein a gap laterally separates at least some of the rectangular display cover layer from the rectangular ring-shaped gasket, wherein each of the four corner brackets has a portion with a recess configured to receive a portion of the rectangular ring-shaped gasket and has a non-recessed portion, wherein the gasket has an L-shaped cross sectional shape over each non-recessed portion, wherein the gasket has an L-shaped cross-section over each non-recessed portion and has an extended portion that covers the non-recessed portion under the gap to block the corner brackets from view through the gap.

18. The electronic device defined in claim 17 wherein the rectangular display cover layer comprises a layer of cover glass.

19. The electronic device defined in claim 18 wherein the corner brackets comprises metal.

20. The electronic device defined in claim 19 wherein the gasket comprises a polymer.

* * * * *